United States Patent
Park et al.

(10) Patent No.: US 7,385,183 B2
(45) Date of Patent: Jun. 10, 2008

(54) SUBSTRATE PROCESSING APPARATUS USING NEUTRALIZED BEAM AND METHOD THEREOF

(75) Inventors: Sung-Chan Park, Seoul (KR); Sung-Wook Hwang, Seoul (KR)

(73) Assignee: Samsung Electronics Co., Ltd. (KR)

( * ) Notice: Subject to any disclaimer, the term of this patent is extended or adjusted under 35 U.S.C. 154(b) by 198 days.

(21) Appl. No.: 11/335,725

(22) Filed: Jan. 19, 2006

(65) Prior Publication Data

US 2006/0163466 A1      Jul. 27, 2006

(30) Foreign Application Priority Data

Jan. 21, 2005   (KR) ............... 10-2005-0005966

(51) Int. Cl.
*H05H 3/02*   (2006.01)
*H01J 37/26*  (2006.01)
*H01S 1/00*   (2006.01)

(52) U.S. Cl. ........... 250/251; 250/492.1; 250/492.2; 250/492.21; 216/56; 216/66; 216/94

(58) Field of Classification Search ............. 250/251
See application file for complete search history.

(56) References Cited

U.S. PATENT DOCUMENTS

| | | | | |
|---|---|---|---|---|
| 4,662,977 A | | 5/1987 | Motley et al. ............... 156/345 |
| 4,713,542 A | * | 12/1987 | Campana ..................... 250/251 |
| 4,775,789 A | * | 10/1988 | Albridge et al. ............ 250/251 |
| 5,795,385 A | * | 8/1998 | Asakawa et al. ........... 117/104 |
| 5,894,058 A | * | 4/1999 | Hatakeyama et al. ....... 430/313 |
| 6,874,443 B2 | * | 4/2005 | Yeom et al. ........... 118/723 CB |
| 6,926,799 B2 | * | 8/2005 | Yeom et al. ........... 156/345.39 |
| 6,935,269 B2 | * | 8/2005 | Lee et al. ................. 118/723 I |
| 7,094,702 B2 | * | 8/2006 | Yeom et al. ................ 438/709 |

(Continued)

FOREIGN PATENT DOCUMENTS

JP       08-008234      1/1996

(Continued)

OTHER PUBLICATIONS

Yan Shi, "Ion-neutralization spectroscopy" (Mar. 13, 2003) <http://www.cem.msu.edu/~cem924sg/YanShi.pdf>.*

(Continued)

*Primary Examiner*—David A. Vanore
*Assistant Examiner*—Bernard Souw
(74) *Attorney, Agent, or Firm*—Mills & Onello LLP

(57) ABSTRACT

In a substrate processing apparatus using a neutralized beam and a method thereof, the substrate processing apparatus includes: an ion source for emitting an ion beam at an emitting angle; reflectors at which the ion beam emitted by the ion source is incident and subject to 2n collisions (where n is a positive integer) in first and second opposite directions to neutralize the ion beam as a neutralized beam and to restore a direction of propagation of the neutralized beam to the emitting angle of the ion beam; and a substrate at which the neutralized beam generated by the reflectors is incident on to perform a process. Accordingly, an incident angle of the resultant neutralized beam is perpendicular to a substrate, while the direction of propagation of the originating ion source and the surface of the substrate are maintained to be perpendicular to each other.

18 Claims, 5 Drawing Sheets

U.S. PATENT DOCUMENTS

| | | | |
|---|---|---|---|
| 7,144,520 B2* | 12/2006 | Ichiki et al. | 216/37 |
| 2002/0033446 A1* | 3/2002 | Ichimura et al. | 250/251 |
| 2002/0060201 A1* | 5/2002 | Yeom et al. | 216/66 |
| 2003/0098126 A1* | 5/2003 | Yeom et al. | 156/345.39 |
| 2003/0209519 A1* | 11/2003 | Yeom et al. | 216/63 |
| 2004/0016876 A1* | 1/2004 | Yeom et al. | 250/251 |
| 2006/0163466 A1* | 7/2006 | Park et al. | 250/251 |
| 2006/0196425 A1* | 9/2006 | Hwang et al. | 188/723 R |
| 2006/0219887 A1* | 10/2006 | Hwang et al. | 250/251 |
| 2007/0068624 A1* | 3/2007 | Jeon et al. | 156/345.4 |
| 2007/0221833 A1* | 9/2007 | Yeom et al. | 250/251 |

FOREIGN PATENT DOCUMENTS

| | | |
|---|---|---|
| KR | 10-2002-0039840 | 5/2002 |
| KR | 10-2003-0042958 | 6/2003 |
| KR | 10-2004-0033524 A | 4/2004 |
| KR | 10-2005-0001058 A | 1/2005 |

OTHER PUBLICATIONS

Markin et al., "Neutralization of low energy He+ions by Cu in the Auger regime", Nucl. Instrum. Meth. Phys. Res. B258 (2007) 18-20.*

* cited by examiner

SUBSTRATE PROCESSING APPARATUS USING NEUTRALIZED BEAM AND METHOD THEREOF

CROSS-REFERENCE TO RELATED PATENT APPLICATION

This application claims the benefit of Korean Patent Application No. 2005-5966, filed on Jan. 21, 2005, in the Korean Intellectual Property Office, the disclosure of which is incorporated herein in its entirety by reference.

BACKGROUND OF THE INVENTION

1. Field of the Invention

The present invention relates to a substrate processing apparatus using a neutralized beam, and more particularly, to a substrate processing apparatus using a neutralized beam thereby maintaining a direction of propagation of an ion source for generating ions and a surface of a substrate in respective positions such that they are perpendicular to each other, and a method thereof.

2. Description of the Related Art

Plasma processing apparatus are commonly used in dry etching processes and in physical or chemical vapor deposition processes. In the plasma processing apparatus, a high-frequency power is applied to a chamber, and, at the same time, reaction gases are supplied into the chamber, so that the reaction gases are dissociated in the chamber to excite plasma by means of glow discharge. Here, ions generated from the plasma are used to perform substrate processing.

Meanwhile, integrated circuit design rules have recently been reduced down to 0.1 μm, or less, as semiconductor devices continue to become more highly integrated. As a result, in order to obtain such hyperfine semiconductor devices, processing conditions of the semiconductor processing apparatus have become more critical. Also, performance of the plasma processing apparatus continues to be improved. Such improvements have been primarily obtained through the-techniques of increasing plasma density or equalizing plasma distribution.

However, irrespective of the manner in which the performance of the plasma is improved, the plasma has associated specific limitations on basic physical properties thereof. Namely, since the plasma includes charged ion particles, the ions can cause various problems during a process, such as transforming a specific material layer into an amorphous layer, changing a chemical composition of a surface layer of a substrate, generating a dangling bond in a surface layer of a substrate, and causing charge-up damage to an insulating layer of a gate.

To solve these problems, a semiconductor processing apparatus using a neutralized beam has been introduced. Namely, a substrate is processed by neutralizing ions generated from the plasma and directing the ions to a surface of a substrate. In different methods of neutralizing ions, the ions can made to collide with neutrons, the ions can be made to collide with electrons, and the ions can be made to collide with a metallic substrate.

A technique that employs a metallic substrate for neutralizing ions is disclosed in U.S. Pat. No. 4,662,977, where the metallic substrate is referred to as a neutralizer plate. The angle of the neutralizer plate is controlled, so that the ions can be directed to the substrate by deflecting the ions at a predetermined angle with respect to a scanning direction.

When the collided ions are directed to the substrate using the neutralizer plate, however, the angle between a plasma source and the substrate is to be inclined at an angle of the collision. However, it is difficult to maintain such an inclined angle at the time of manufacturing or managing the apparatus. In addition, since the plasma source is inclined, the path of the ions can be altered depending on the plurality of incidence positions. This can lead to a reduction in incidence uniformity.

SUMMARY OF THE INVENTION

The present invention provides a substrate processing apparatus using a neutralized beam by colliding ions, which are incident on reflectors on which the ions are neutralized, 2n times (n=positive integer) in symmetrical directions, so that the direction of propagation of the original ion source can be perpendicular to the surface of the substrate to be treated, and a method thereof.

In one aspect, the present invention is directed to an etching apparatus comprising: a plasma generating unit; a grid unit that extracts ions from the plasma generating unit and that emits the ions as an ion beam; reflectors at which the ion beam emitted by the grid unit is incident at an incident angle and undergoes a first collision at a collision angle at which the ions are neutralized as a neutralized beam, and at which the neutralized beam undergoes a second collision at the collision angle that restores the neutralized beam to the incident angle; and a substrate stage that mounts a substrate at which the neutralized beam generated from the reflectors is incident to perform substrate processing.

In one embodiment, the directions of the first and second collisions are symmetrical to each other.

In another embodiment, the incident angle of the ion beam is perpendicular to the surface of the substrate.

In another embodiment, the incident angle of the neutralized beam is perpendicular to the surface of the substrate.

In another embodiment, the first and second collisions occur 2n (n=positive integer) times in the reflectors.

In another embodiment, the collision angle is in a range of about 3° to about 10°.

In another embodiment, the reflectors include a plurality of reflecting plates disposed in parallel between the grid unit and the substrate.

In another embodiment, the reflecting plates include a first reflecting plate, at which the first collision occurs, and a second reflecting plate, at which the second collision occurs, wherein the second reflecting plate is disposed to face the first reflecting plate.

In another embodiment, the reflectors include a first reflector, at which the first collision occurs, and the second reflector, at which the second collision occurs, wherein the second reflector is separated from the first reflector along a direction of ion beam propagation.

In another aspect, the present invention is directed to a substrate processing apparatus comprising: an ion source for emitting an ion beam at an emitting angle; reflectors at which the ion beam emitted by the ion source are incident and subject to 2n collisions, where n is a positive integer, in first and second opposite directions to neutralize the ion beam as a neutralized beam and to restore a direction of propagation of the neutralized beam to the emitting angle of the ion beam; and a substrate at which the neutralized beam generated by the reflectors is incident to perform a process.

In one embodiment a first collision of the ion beam and a second collision of the ion beam occur in the reflectors in the first and second opposite directions that are symmetrical.

In another embodiment, the collisions occur at a collision angle that is in a range of about 3° to about 10°.

In another embodiment, the emitting angle of the ion beam and the restored direction of propagation of the neutralized beam are perpendicular to the surface of the substrate.

In another embodiment, the ion source includes a plasma generating unit and a grid unit for extracting ions from the plasma generating unit and for emitting the ions as the ion beam.

In another embodiment, the reflectors include a plurality of reflecting plates disposed in parallel between the ion source and the substrate.

In another embodiment, the reflecting plates include a first reflecting plate, at which a first collision occurs, and a second reflecting plate, at which a second collision occurs, wherein the second reflecting plate is disposed to face the first reflecting plate.

In another embodiment, the reflectors include a first reflector, at which a first collision occurs, and a second reflector, at which a second collision occurs, wherein the second reflector is separated from the first reflector along a direction of ion beam propagation.

In another aspect, the present invention is directed to a substrate processing method comprising steps of: extracting ions from a plasma to form an ion beam at an emitting angle; neutralizing the ion beam to be a neutralized beam, having a direction of propagation that is aligned with the emitting angle of the ion beam, by colliding the ion beam with reflectors at a collision angle; and processing a substrate by illuminating the neutralized beam onto the substrate.

In one embodiment, colliding results in the occurrence of 2n (n=positive integer) collisions in the reflectors.

In another embodiment, neutralizing further comprises: first colliding the ion beam to be neutralized to generate a neutralized beam; and second colliding the neutralized beam to restore the direction of propagation thereof to be aligned with the angle of the ion beam prior to the first collision.

In another embodiment, the emitting angle of the ion beam and the direction of propagation of the neutralized beam are oriented perpendicular to the substrate.

In another embodiment, the collision angle is in a range of about 3° to about 10°.

In another embodiment, the step of processing the substrate is an etching process.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Hereinafter, a substrate processing apparatus using a neutralized beam according to an embodiment of the present invention will be described in detail with reference to the accompanying drawings.

Figure 1:
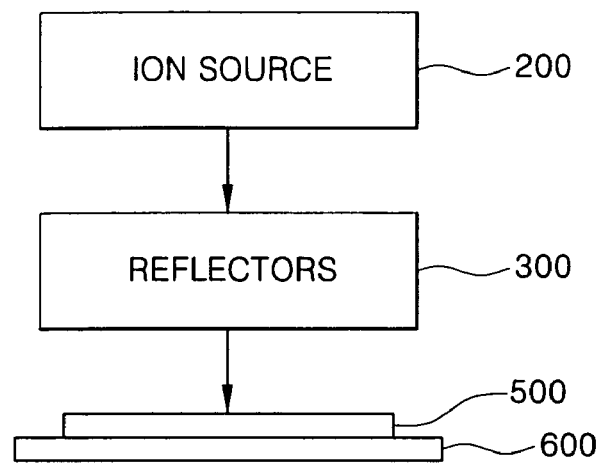
FIG. 1 is a schematic diagram of a substrate processing apparatus using a neutralized beam according to the present invention.

Referring to FIG. 1, the substrate processing apparatus includes an ion source 200, reflector unit 300, a substrate 500, and a substrate stage 600 on which the substrate 500 is mounted. Here, the ion source 200 and the substrate 500 are disposed to be parallel with each other. In addition, an angle of orientation of the ions, or ion beam, emitted by the ion source 200 is maintained to be equal to an angle of a neutralized beam which is neutralized by the reflector unit 300 and is incident on the substrate 500.

Namely, if an angle at which the ions are emitted to the reflector unit 300 is perpendicular to a surface of the substrate 500, then also the angle that the neutralized beam output by the reflector unit 300 is incident on the substrate 500 is implemented to be perpendicular. Here, an implementation of the apparatus of the invention in a perpendicular manner is a goal to be achieved at a schematic design level. In other words, when the apparatus is manufactured in practice, certain errors can occur. Thus, when a perpendicular angle is mentioned in connection with the embodiment of the invention, a certain error range is taken into consideration.

Figure 2:
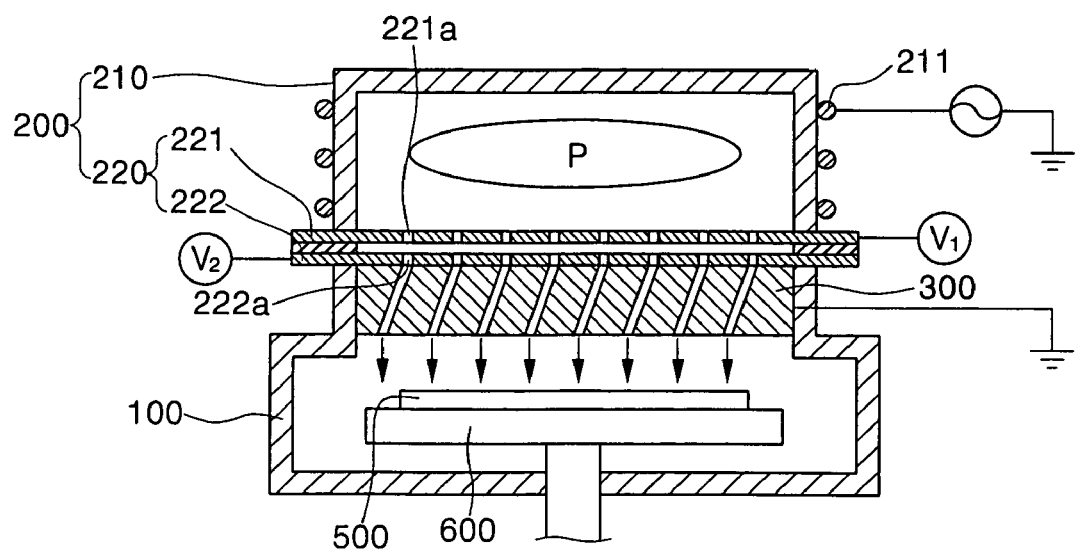
FIG. 2 is a structural block diagram of the substrate processing apparatus using a neutralized beam according to the present invention.

Referring to FIG. 2, the embodiment of the present invention will be described in more detail. The substrate processing apparatus includes a chamber 100 and an ion source 200 provided in the chamber 100. The ion source 200 includes a plasma generating unit 210 and a grid unit 220 disposed at the lower part of the plasma generating unit 210.

The plasma generating unit 210 may include an inductively coupled plasma (ICP) that generates a plasma by applying an inductive power, or a capacitively coupled plasma (CCP).

The grid unit 220 includes a first grid 211, on which a first though-hole 221a is formed, and a second grid 222, on which a second though-hole 221b is formed, where both of the grids are operatively coupled to each other. Different voltages are respectively applied to the first and second grids 221 and 222, so that plasma ions can be extracted through the through-holes 221a, 221b based on a voltage difference applied to the first and second grids 221 and 222. Meanwhile, although not shown, a third grid can be additionally provided. Here, the third grid is grounded before installation thereof, so that a directional property of the ions can be sufficiently maintained.

On the other hand, the ions generated from the grid unit 220 are generally emitted in a direction that is perpendicular to a surface of the substrate 500 in the chamber below the grid unit 200. Here, the angles of emitted ions may actually have minute differences. In the present invention, however, difference of the emitting angles is taken into consideration whenever a perpendicular angle is mentioned herein.

Figure 3:
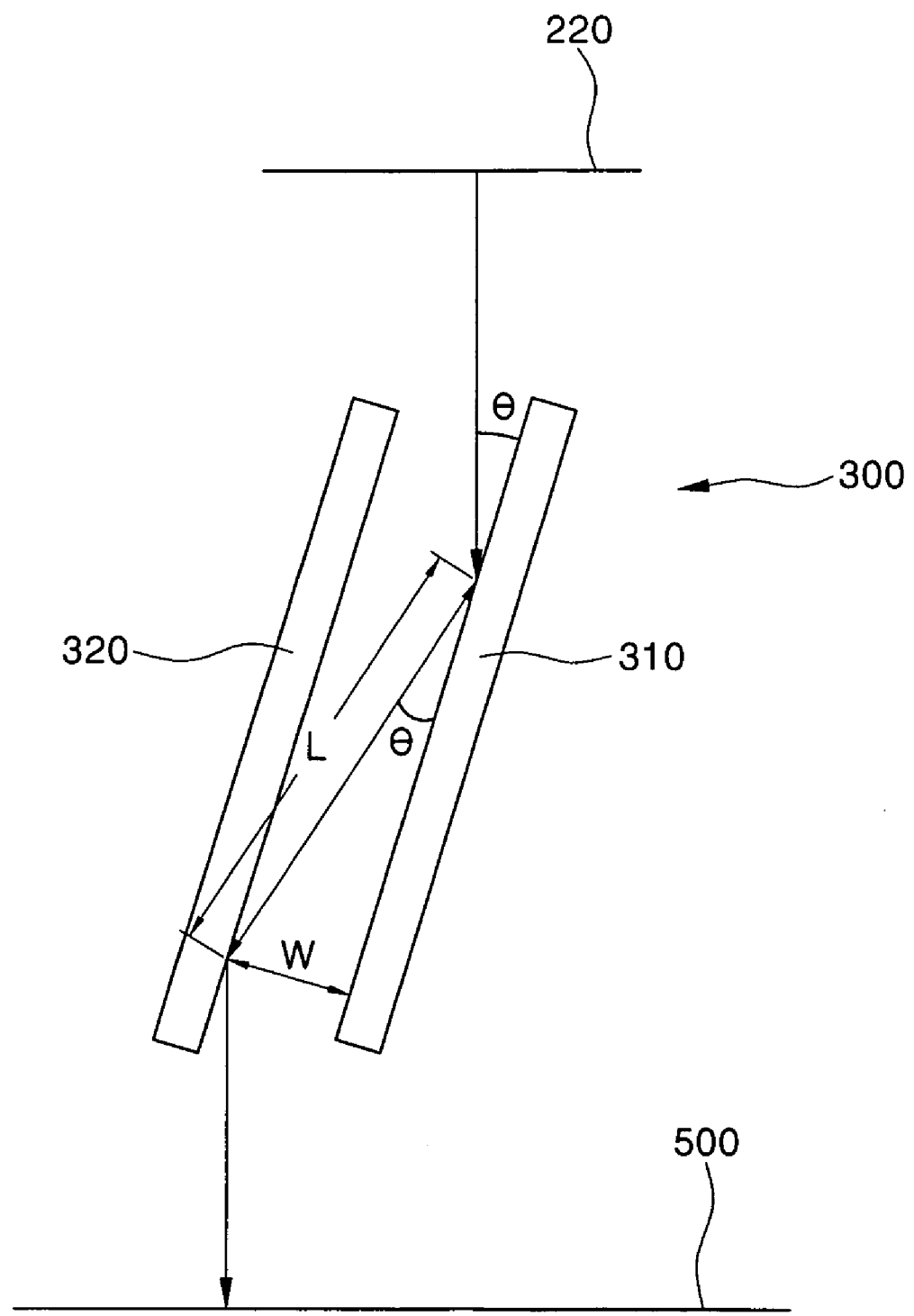
FIG. 3 is a view illustrating a state of collision of ions in the substrate processing apparatus using a neutralized beam according to the present invention.
Figure 4A:
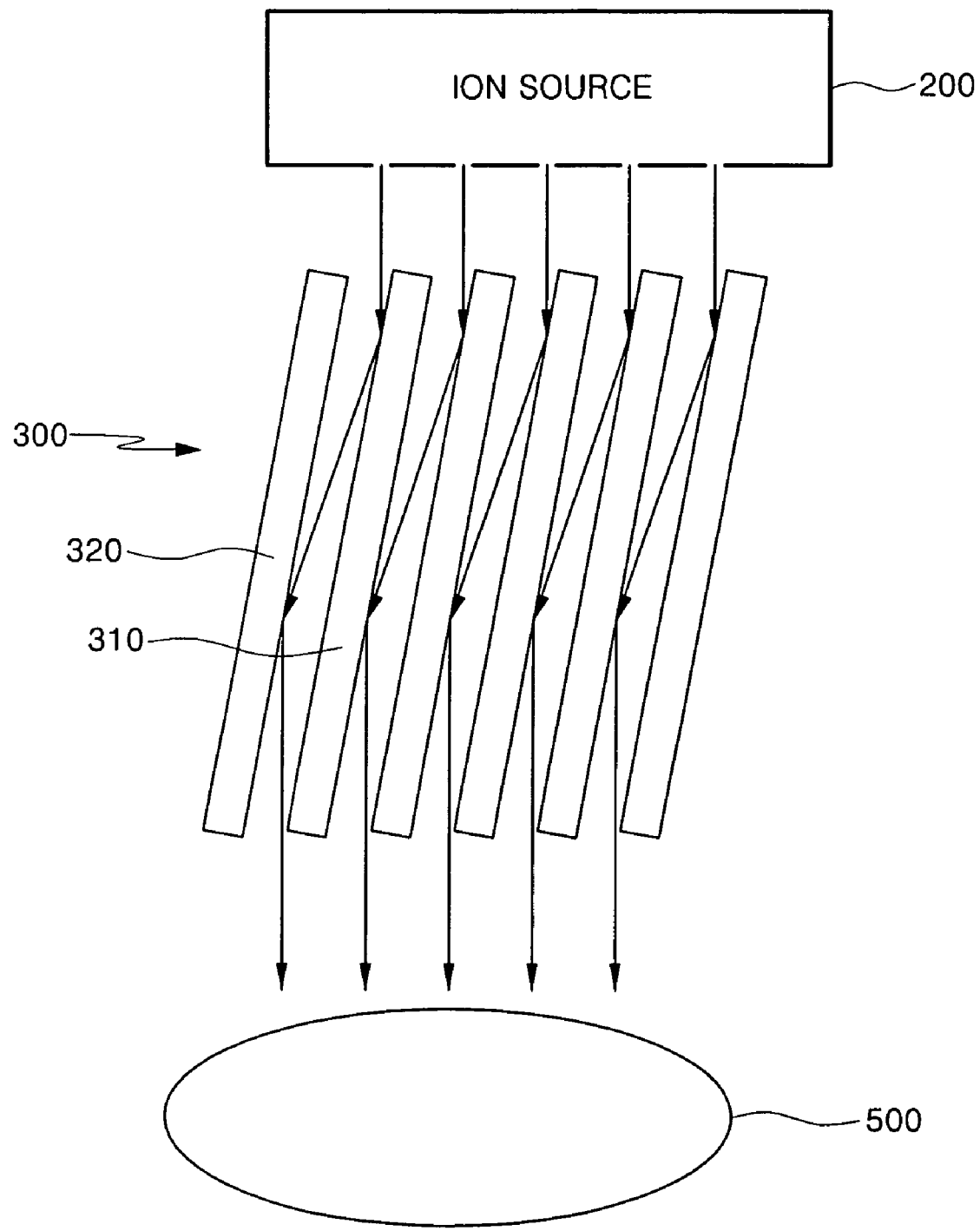
FIG. 4A is a view illustrating reflectors of the substrate processing apparatus using a neutralized beam according to an embodiment of the present invention.

In the lower part of the grid unit 220, the reflector unit 300 is disposed. Referring to FIGS. 3 and 4A, a plurality of reflecting plates 310, 320 having surfaces that are parallel to each other and at a constant interval are disposed to be inclined in the reflector unit 300, so that a cross-sectional pattern thereof is generally in the shape of a grill.

In one embodiment, the body of the reflector unit 300 is grounded. In addition, the reflecting plates are made of metal materials, such as tantalum, platinum, molybdenum, tungsten, aurum, and stainless. In another embodiment of the present invention, the reflector unit 300 may be formed in such a shape that a plurality of inclined holes are formed in a cylindrical tube.

In the reflector unit 300, the ions propagate along a reflective path such that they each collide 2n times (n=positive integer) in the path. The reflective paths are disposed in parallel with each other as shown in FIG. 3 and are formed between the first and second reflecting plates 310 and 320 which are disposed to be inclined at a collision angle in a range of about 3° to about 10° relative to the incident direction of the ion beam. In addition, the reflective paths are configured such that the number of ion-collisions for an incident ion is a multiple-of-two times, or 2n (n=positive integer) times.

Meanwhile, in a case where the collision angle between the ions and the first and second reflecting plates 310 and 320 is less than about 3°, the ion neutralization ratio sharply decreases, while in a case where the collision angle is more than about 10°, unnecessary sputtering can be excessively generated in the first and second reflecting plates 310 and 320. Therefore, it can be understood that the angle in a range of about 3° to about 10° is an adequate collision angle.

Hence, the ions first collide with the first reflecting plate 310 within the reflective path at the angle in a range of about 3° to 10°. Then, the ions are reflected in a direction that is symmetrical to the first collision and collide a second time at the second reflecting plate 320 at the angle in the range of about 3° to 10°. At the first collision, the ions are neutralized, while at the second collision, the original incidence angle of the ions prior to the first collision with the reflecting plate 310 is restored. Therefore, the lengths of the first and second reflecting plates of the reflector unit 300 must be long enough, to ensure that two collisions can be carried out.

Referring to FIG. 3, assuming the collision angle of the ions with the reflector unit is θ, the distance between the first and second collisions is L, and the gap between the first and second reflecting plates 310 and 320, or the width of collision path, is W, then the lengths of the reflectors in the reflector unit 300 can be obtained by the following mathematical equation: sin θ=W/L. Here, the lengths of the reflectors in the reflector unit 300 are selected to be equal to, or greater than, L and less then 2 L, so that additional collisions can be avoided after the second collision occurs.

A theoretical ground of the neutralization is disclosed in the thesis of B. A. Helmer and D. B. Graves, which is titled "Molecular dynamics simulation of C12+ impacts onto a chlorinated silicon surface: Energies and angles of the reflected C12 and C1 fragments" (J. Vac. Sci. Techonol. A 12 (5), Septemper/October 1999).

At the lower part of the reflectors 300, the substrate stage 600 disposed to be in parallel to the surface of the grid unit 220 is provided. In the substrate stage 600, the substrate 500, on which a substrate process using the generated neutralized beam is performed, is disposed in parallel to the substrate stage 600. The substrate 500 comprises, for example, a semiconductor device wafer, a thin film display, or other hyperfine structure. In addition, the process performed on the substrate 500 may be an etching process.

Figure 4B:
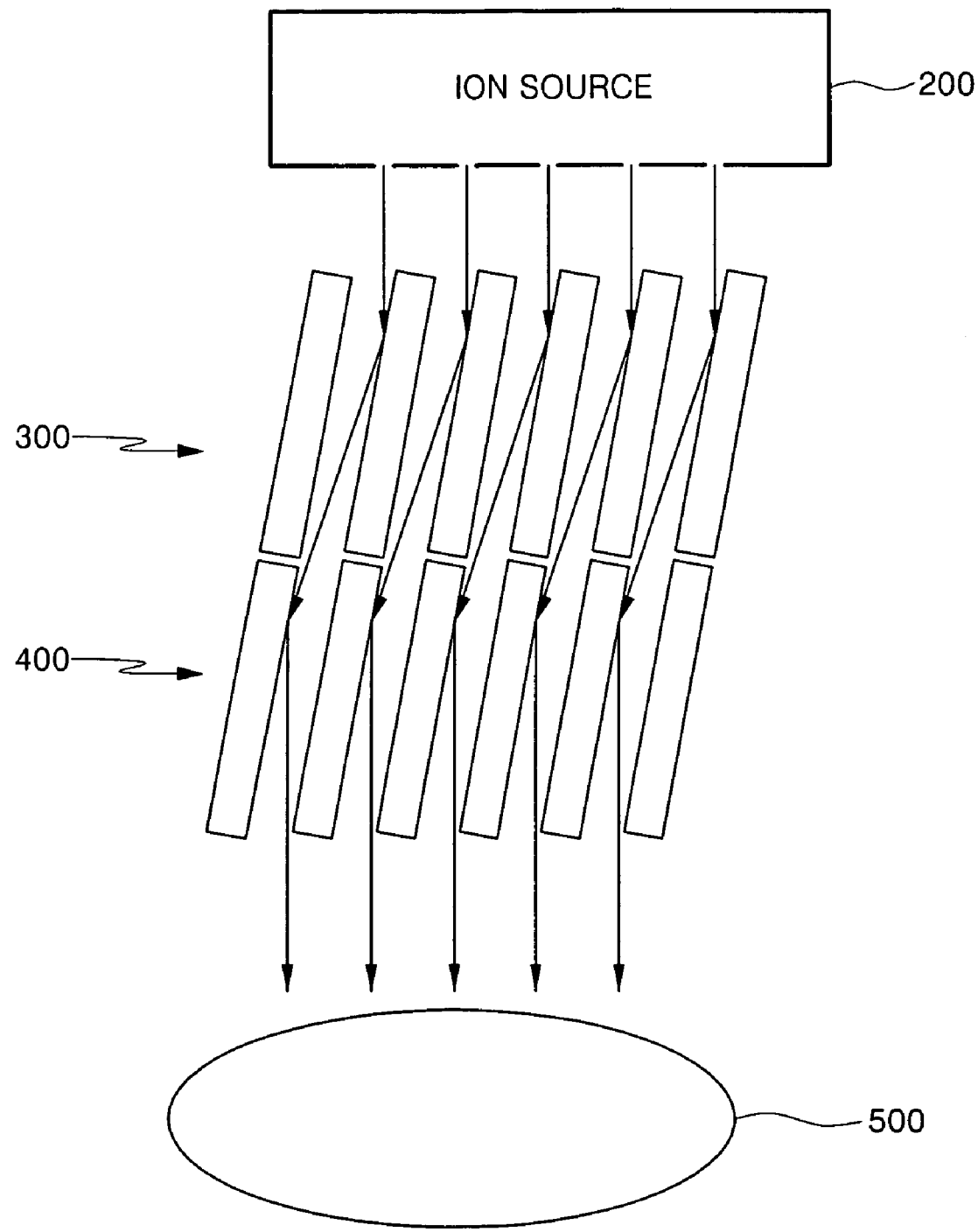
FIG. 4B is a view illustrating reflectors of the substrate processing apparatus using a neutralized beam according to another embodiment of the present invention.

Meanwhile, according to the embodiment of the present invention, the first and second ion collisions can be carried out in a single reflector unit 300 as shown in FIG. 4A, however, in another embodiment of the present invention, each of the first and second collisions can be carried out in separate first and second serially arranged reflector units 300 and 400 as shown in FIG. 4B (like reference numerals in FIGS. 4A and B denote like elements).

Referring to FIG. 4B, the reflector units include the first reflector unit 300, which is adjacent to the grid unit 220 and on which the first ion collision occurs so that the ions are neutralized, and the second reflector unit 400, which is provided at the lower part of the first reflector unit 300, and separated from the first reflector unit 300 and within which the second collision occurs so that the incident angle of the neutralized beam is to be restored to the first ion collision angle.

By providing two separate reflector units 300 and 400, ion collision occurs only a single time in a single reflector path, so that overheating of the reflector units caused by the ion collisions can be minimized. In addition, since ion neutralization is achieved in the first reflector unit 300, in the case of the second reflector unit 400, since ion neutralization is not necessary, it can be formed of a variety of non-metal materials such as ceramic and reinforced resin.

In addition, the total length of the first reflector unit 300, on which the first collision occurs, and the second reflector unit 400, on which the second collision occurs, can be obtained by the aforementioned mathematical equation by which the lengths of the reflectors and the widths of reflecting plates in the respective reflectors can be determined.

Hereinafter, a substrate processing method according to the embodiment of the present invention will be described.

Figure 5:
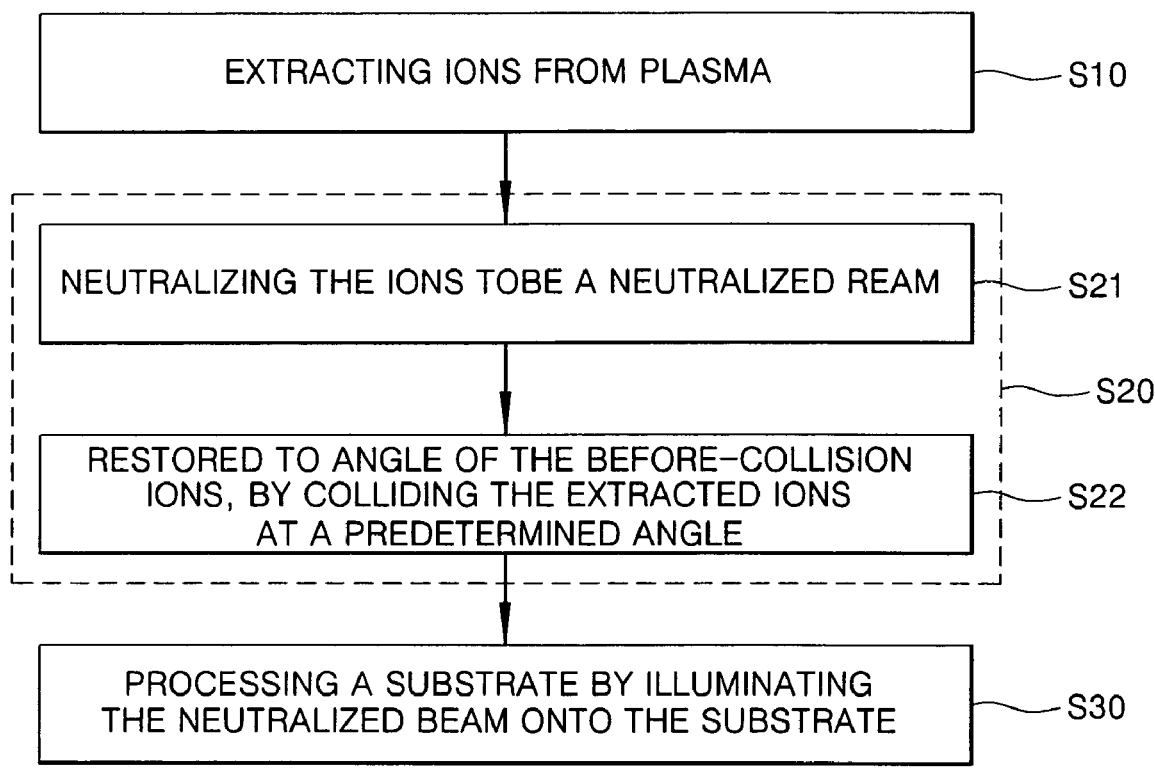
FIG. 5 is a block diagram illustrating a substrate processing method using a neutralized beam according to the present invention.

Referring first to FIGS. 2 and 5, ions are extracted from an ion source 200 (S10). In order to extract the ions, a high-frequency power is applied to a plasma generating unit 210 in the ion source 200 so that the plasma is generated by the plasma generating unit 210. Here, reaction gases, such as CxFy, which are required to generate the plasma, are also supplied in the plasma generating unit 210, and the interior thereof is maintained at a pressure of about $10^{-3}$ to $10^{-5}$ torr.

Next, the ions are extracted from the plasma generated from the plasma generating unit 210. The extraction of the ions is carried out in a grid unit 220. Namely, different voltages V1 and V2 are respectively applied to the first and second grids 221 and 222, so that the plasma ions are extracted based on the voltage difference (S21). Here, an electric potential in a range of 100 to 1,000 V can be selected based on properties of the substrate 500 undergoing processing. In addition, the extracted ions are emitted in a direction that is perpendicular to the surface of the substrate 500.

The extracted ions are next neutralized to be a neutral beam, and the incident angle of the ions is restored (S20). In this step, the ions are first collided with the reflector at a collision angle in a range of about 3° to 10°. In this collision, the ions obtain electrons from the reflectors and are neutralized to become a neutral beam (S21). The neutralized beam collides a second time with the reflectors in a direction that is symmetrical with the first collision. At the second collision, the neutralized beam is restored to the original angle of incidence of the ions at the time of the first collision (S22). Next, the neutralized beam restored to be perpendicular to the substrate 500 arrives at the substrate 500, so that a desired substrate process, such as an etching process, can be carried out (S30).

Accordingly, in a substrate processing apparatus using a neutralized beam and a method thereof, an incident angle of a neutralized beam is perpendicular to a substrate, while the direction of propagation of the ion source and the surface of the substrate are substantially perpendicular to each other. In this manner, the substrate processing apparatus can be placed in a perpendicular configuration, and thus there is an advantage in facilitating proper manufacturing and managing thereof. In addition, since the ion source is disposed such that the direction of propagation is perpendicular to the surface of the substrate, there is an improvement in incidence uniformity with respect to a path difference of the beam and processing uniformity at a time when the substrate processing is performed.

The present invention may be embodied in many different forms and should not be construed as being limited to the embodiments set forth herein. Namely, a shape, material, or type of the substrate of the reflector and a type, size, and constitution of the ion source can be varied according to a method that is necessary for a process. In addition, the present invention is adoptable to etching apparatus, as described above, and also to deposition apparatus and other types of substrate processing apparatus, This present invention is applicable to embodiments that are implemented such that an emitting angle of the ions and an incident angle of the neutralized beam with respect to the substrate are maintained to be equal by colliding the ions 2n times (n=positive integer), and the incident angle of the neutralized beam is to be perpendicular to the surface of the substrate.

While this invention has been particularly shown and described with references to preferred embodiments thereof, it will be understood by those skilled in the art that various changes in form and details may be made herein without departing from the spirit and scope of the invention as defined by the appended claims.

What is claimed is:

1. An etching apparatus comprising:
a plasma generating unit;
a grid unit that extracts ions from the plasma generating unit and that emits the ions as an ion beam;
reflectors at which the ion beam emitted by the grid unit is incident at an incident angle and undergoes a first collision at a collision angle at which the ions are neutralized as a neutralized beam, and at which the neutralized beam undergoes a second collision at the collision angle that restores the neutralized beam to the incident angle; and
a substrate stage that mounts a substrate at which the neutralized beam generated from the reflectors is incident to perform substrate processing, wherein the reflectors include a plurality of reflecting plates disposed in parallel between the grid unit and the substrate, wherein the reflecting plates include a first reflecting plate, at which the first collision occurs, and a second reflecting plate, at which the second collision occurs, and wherein the second reflecting plate is disposed to face the first reflecting plate, and the grid unit and the substrate are disposed to be in parallel with each other.

2. The apparatus according to claim 1, wherein directions of the first and second collisions are symmetrical to each other.

3. The apparatus according to claim 1, wherein the incident angle of the ion beam is perpendicular to the surface of the substrate.

4. The apparatus according to claim 1, wherein the incident angle of the neutralized beam is perpendicular to the surface of the substrate.

5. The apparatus according to claim 1, wherein the first and second collisions occur 2n (n=positive integer) times in the reflectors.

6. The apparatus according to claim 1, wherein the collision angle is in a range of about 30° to about 10°.

7. The apparatus according to claim 1, wherein the second reflecting plate is separated from the first reflecting plate along a direction of ion beam propagation.

8. A substrate processing apparatus comprising:
an ion source for emitting an ion beam at an emitting angle;
reflectors at which the ion beam emitted by the ion source are incident and subject to 2n collisions, where n is a positive integer, in first and second opposite directions to neutralize the ion beam as a neutralized beam and to restore a direction of propagation of the neutralized beam to the emitting angle of the ion beam; and
a substrate at which the neutralized beam generated by the reflectors is incident to perform a process, wherein the reflectors include a plurality of reflecting plates disposed in parallel between the ion source and the substrate, wherein the reflecting plates include a first reflecting plate, at which a first collision occurs, and a second reflecting plate, at which a second collision occurs, and wherein the second reflecting plate is disposed to face the first reflecting plate, and the ion source and the substrate are disposed to be in parallel with each other.

9. The apparatus according to claim 8, wherein a first collision of the ion beam and a second collision of the ion beam occur in the reflectors in the first and second opposite directions that are symmetrical.

10. The apparatus according to claim 8, wherein the collisions occur at a collision angle that is in a range of about 3° to about 10°.

11. The apparatus according to claim 8, wherein the emitting angle of the ion beam and the restored direction of propagation of the neutralized beam are perpendicular to the surface of the substrate.

12. The apparatus according to claim 8, wherein the ion source includes a plasma generating unit and a grid unit for extracting ions from the plasma generating unit and for emitting the ions as the ion beam.

13. The apparatus according to claim 8, wherein the second reflecting plate is separated from the first reflecting along a direction of ion beam propagation.

14. A substrate processing method comprising:
extracting ions from a plasma to form an ion beam at an emitting angle;
neutralizing the ion beam to be a neutralized beam, having a direction of propagation that is aligned with the emitting angle of the ion beam, by colliding the ion beam with a plurality of reflectors at a collision angle; and
processing a substrate by illuminating the neutralized beam onto the substrate, wherein neutralizing the ion beam further comprises:
first colliding the ion beam to be neutralized to generate a neutralized beam; and
second colliding the neutralized beam to restore the direction of propagation thereof to be aligned with the angle of the ion beam prior to the first collision.

15. The method according to claim 14, wherein colliding results in the occurrence of 2n (n =positive integer) collisions in the reflectors.

16. The method according to claim 14, wherein the emitting angle of the ion beam and the direction of propagation of the neutralized beam are oriented perpendicular to the substrate.

17. The method according to claim 14, wherein the collision angle is in a range of about 3° to about 10°.

18. The method according to claim 14, wherein the step of processing the substrate is an etching process.

* * * * *

UNITED STATES PATENT AND TRADEMARK OFFICE
CERTIFICATE OF CORRECTION

PATENT NO. : 7,385,183 B2  Page 1 of 1
APPLICATION NO. : 11/335725
DATED : June 10, 2008
INVENTOR(S) : Sung-Chan Park et al.

It is certified that error appears in the above-identified patent and that said Letters Patent is hereby corrected as shown below:

Column 7, line 64 delete "30" and insert --3--

Signed and Sealed this

Eleventh Day of November, 2008

JON W. DUDAS
*Director of the United States Patent and Trademark Office*